United States Patent
Kasahara et al.

(10) Patent No.: US 9,029,266 B2
(45) Date of Patent: May 12, 2015

(54) SEMICONDUCTOR DEVICE MANUFACTURING METHOD

(71) Applicant: Kabushiki Kaisha Toshiba, Toyko (JP)

(72) Inventors: Yusuke Kasahara, Kanagawa (JP); Noriko Sakurai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/971,922

(22) Filed: Aug. 21, 2013

(65) Prior Publication Data
US 2014/0199847 A1 Jul. 17, 2014

(30) Foreign Application Priority Data
Jan. 11, 2013 (JP) .................................. 2013-003602

(51) Int. Cl.
| | |
|---|---|
| H01L 21/311 | (2006.01) |
| H01L 21/308 | (2006.01) |
| H01L 21/033 | (2006.01) |
| H01L 21/3213 | (2006.01) |
| H01L 27/115 | (2006.01) |

(52) U.S. Cl.
CPC ...... *H01L 21/0337* (2013.01); *H01L 21/31144* (2013.01); *H01L 21/32137* (2013.01); *H01L 21/32139* (2013.01); *H01L 27/11556* (2013.01); *H01L 27/11582* (2013.01)

(58) Field of Classification Search
CPC .................................................... H01L 21/308
USPC ............. 257/77, E29.295, E31.041; 438/474, 438/499, 613, 653, 694, 703
See application file for complete search history.

(56) References Cited

U.S. PATENT DOCUMENTS

| | | | | |
|---|---|---|---|---|
| 3,814,641 | A | * | 6/1974 | Reinberg et al. ................. 216/99 |
| 5,665,203 | A | * | 9/1997 | Lee et al. ....................... 438/585 |
| 2010/0276743 | A1 | * | 11/2010 | Kuniya et al. .................. 257/315 |
| 2012/0067843 | A1 | | 3/2012 | Watanabe et al. |

FOREIGN PATENT DOCUMENTS

| | | |
|---|---|---|
| JP | 2008036491 | 2/2008 |
| JP | 2012-054283 | 3/2012 |
| JP | 2012064783 A | 3/2012 |

OTHER PUBLICATIONS

Christian Hollauer, Physics of Thermal Oxidation, May 14, 2010, p. 1.*
Christian Hollauer, Nitrided Oxide Films, Aug. 9, 2009, pp. 1-4.*

* cited by examiner

*Primary Examiner* — Fernando L Toledo
*Assistant Examiner* — Adam S Bowen
(74) *Attorney, Agent, or Firm* — Patterson & Sheridan, LLP (57) ABSTRACT

According to one embodiment, a semiconductor device manufacturing method includes depositing a silicon film above a semiconductor substrate, forming an insulating film which includes silicon oxide or silicon nitride on the silicon film, forming a physical guide having a depressed portion above the insulating film, forming a directed self-assembly material layer which includes a first polymer and a second polymer in the depressed portion of the physical guide, phase-separating the directed self-assembly material layer into a first region which includes the first polymer and a second region which includes the second polymer, removing the second region, processing the insulating film by using the physical guide and the first region as masks, and transferring a pattern corresponding to the second region to the insulating film. Further, the silicon film is processed by using the pattern transferred onto the insulating film as a mask.

18 Claims, 7 Drawing Sheets

SEMICONDUCTOR DEVICE MANUFACTURING METHOD

CROSS-REFERENCE TO RELATED APPLICATION

This application is based upon and claims the benefit of priority from Japanese Patent Application No. 2013-003602, filed Jan. 11, 2013, the entire contents of which are incorporated herein by reference.

FIELD

Embodiments described herein relate generally to a semiconductor device manufacturing method.

BACKGROUND

Lithography technology in a semiconductor element manufacturing process, such as a double patterning technology using ArF immersion exposure, EUV lithography, nanoimprinting, and the like, are known. Lithography technology in the related art includes various problems, such as higher manufacturing costs, deteriorating alignment precision, slower throughput, and the like, that accompany attempts to miniaturize the lithographic exposure pattern.

Under such a situation, application of Directed Self-Assembly (DSA) techniques to lithography technology is expected. Since the DSA techniques are accomplished as a result of autonomous energy stability, it is possible to form a pattern with high dimensional precision. In particular, a technology which uses the micro-phase separation of a polymeric block copolymer can enable formation of a periodic structure having various shapes of several nanometers (nm) to hundreds of nm in size using simple liquid application and annealing processes. A micro-domain structure is changed to a spherical shape, a pillar shape, a layered shape, or the like, depending on the composition ratio of a polymeric block copolymer, feature size is changeable depending on molecular weight, and thus it is possible to form holes, pillars, and line patterns of various dimensions.

However, it is difficult to use a pattern forming method using DSA in the related art for forming a high-aspect ratio pattern, and for an integrated process of a multi-layered film.

DETAILED DESCRIPTION

In general, according to one embodiment, there is provided a semiconductor device manufacturing method including depositing a silicon film above a semiconductor substrate, forming an insulating film which includes silicon oxide or silicon nitride on the silicon film, forming a physical guide having at least one depressed portion above the insulating film, forming a directed self-assembly material layer which includes a first polymer and a second polymer in the depressed portion of the physical guide, phase-separating the directed self-assembly material layer into a first region which includes the first polymer and a second region which includes the second polymer, removing the second region, processing the insulating film by using the physical guide and the first region as masks and transferring a pattern corresponding to the second region to the insulating film, and processing the silicon film by using the pattern transferred onto the insulating film as a mask.

Hereinafter, exemplary embodiments will be described with reference to the accompanying drawings.

FIGS. 1 to 8 are cross-sectional views illustrating the processes of a semiconductor device manufacturing method according to the embodiment. Meanwhile, in the embodiment below, a Bit Cost Scalable (BiCS) structure memory is prepared, which includes alternately layered electrode layers and interlayer insulating films, and a cylinder electrode which penetrates therethrough.

Figure 1:
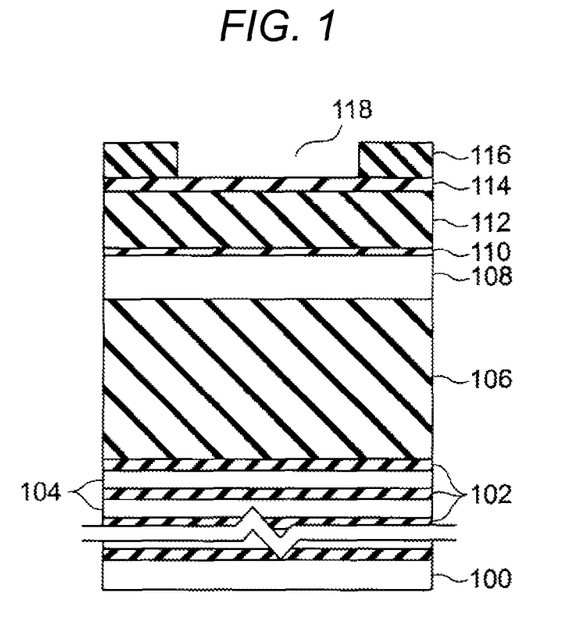
FIG. 1 is a cross-sectional view illustrating a process of a semiconductor device manufacturing method according to an embodiment.

First, as shown in FIG. 1, TEOS films 102 and amorphous silicon films 104 are alternately layered on a silicon substrate 100. For example, the TEOS films 102 have a film thickness of 35 nm, and are formed by plasma enhanced chemical vapor deposition (PECVD) in a chamber. In addition, for example, the amorphous silicon films 104 have a film thickness of 50 nm, and are formed by PECVD. In addition, for example, 24 layers of TEOS films 102 and amorphous silicon films 104 are alternately formed one upon the other.

Subsequently, an organic film 106 is formed on the layered TEOS films 102 and amorphous silicon films 104. For example, the organic film 106 has a film thickness of 1 μm, and is formed by PECVD. The organic film 106 is used as a mask when the layered TEOS films 102 and amorphous silicon films 104 are processed in a subsequent step. The organic film 106 should have a sufficiently large film thickness (for example, 500 nm or greater). It is possible to use, for example, a carbon film as the organic film 106.

Subsequently, for example, a silicon film 108 which has a film thickness of 60 nm is formed by PECVD on the organic film 106. Since the silicon film 108 is used as a mask when the thick organic film 106 is processed in a subsequent process, the silicon film 108 should have a sufficiently large film thickness (for example, 50 nm or greater).

Thereafter, if the silicon substrate 100 on which the silicon film 108 is formed is taken out from the chamber and is exposed to air, a natural oxidation film 110, which has a film thickness to the extent of 1 to 2 nm, is formed on the surface of the silicon film 108.

Subsequently, an organic film 112 is formed on the natural oxidation film 110. For example, after applying Spin-On Carbon (SOC) on the natural oxidation film 110, a baking process is performed, thereby forming the organic film 112 which is formed of an SOC film having a film thickness of 100 nm.

Subsequently, the baking process is performed after applying Spin-On Glass (SOG) on the organic film 112, thereby forming an SOG film 114 which has a film thickness of 30 nm.

Subsequently, a resist 116 is applied on the SOG film 114 and is exposed and developed using an ArF excimer laser, thereby forming a desired hole pattern 118. The planar shape of the hole pattern 118 corresponds to the micro-phase separation site of a block copolymer formed in a subsequent process, and has a rectangular shape, a circular shape, an elliptical shape, or the like in a top view. In the embodiment, the hole pattern 118 is formed to have an elliptic planar shape.

Figure 2:
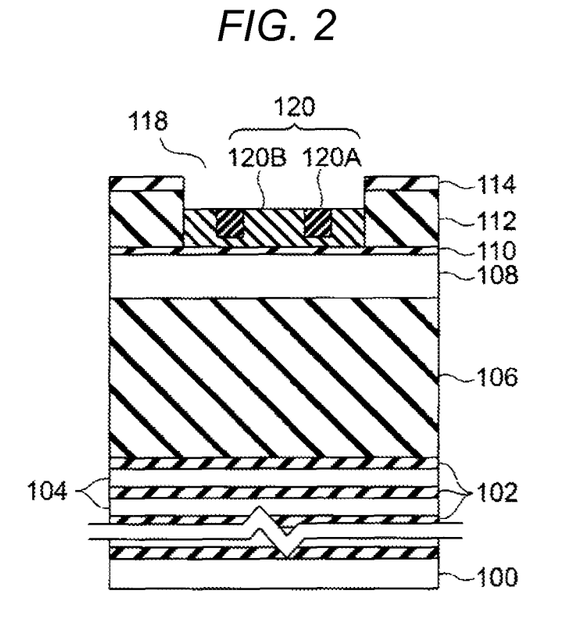
FIG. 2 is a cross-sectional view illustrating a process which is subsequent to FIG. 1.

Subsequently, as shown in FIG. 2, Reactive Ion Etching (RIE) is performed by using the resist 116 as a mask, and the hole pattern 118 is transferred to the SOG film 114. Further, the RIE is performed by using the SOG film 114, to which the hole pattern 118 is transferred, as a mask, and the hole pattern 118 is transferred to the organic film 112. Therefore, a physical guide which includes the organic film 112 and the SOG film 114 is formed.

Subsequently, the block copolymer (DSA material) is applied. For example, a Polyethylene Glycol Monomethyl Ether Acetate (PGMEA) solution which includes the block copolymer (PS-b-PMMA) of polystyrene (PS) and Poly Methyl MethAcrylate (PMMA) at a concentration of 2.0 wt % is rotationally applied at a rotation rate of 1500 rpm.

The applied block copolymer flows into the depressed portion (hole pattern 118) of the physical guide, and thus a block copolymer layer is formed. Thereafter, the silicon substrate 100 is placed on a hot plate (not shown in the drawing), heated at 110° C. for 90 seconds, and, further, heated in a nitrogen atmosphere at 220° C. for 3 minutes. The block copolymer layer is therefore phase-separated, and a micro-phase separation pattern 120, which includes a cylindrical first polymer section 120A configured to have the PMMA and a second polymer section 120B configured to have the PS and provided to surround the first polymer section 120A, is formed. The side surface and bottom surface of the cylindrical first polymer section 120A are surrounded by the second polymer section 120B.

Figure 3:
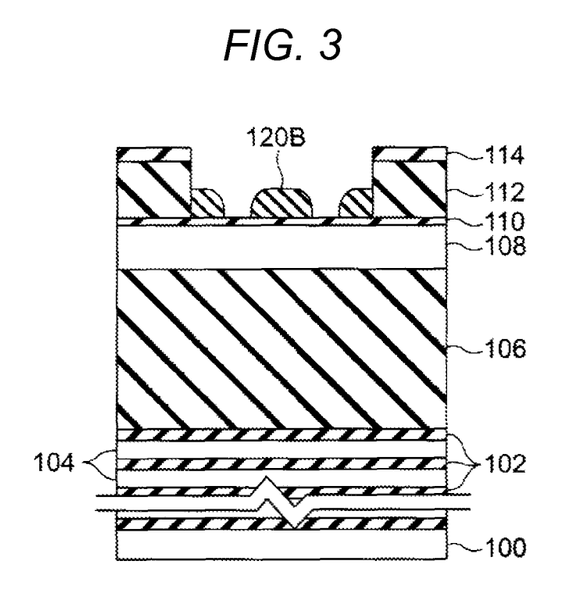
FIG. 3 is a cross-sectional view illustrating a process which is subsequent to FIG. 2.

Subsequently, as shown in FIG. 3, the first polymer section 120A in the micro-phase separation pattern 120 is selectively removed by a wet development process. Further, etch back is performed using RIE, and thus the second polymer section 120B which is located on the lower side of the first polymer section 120A is removed, thereby exposing the upper surface of the natural oxidation film 110. After the etch back is performed, the film thickness of the remaining second polymer section 120B is, for example, about 40 nm.

Figure 4:
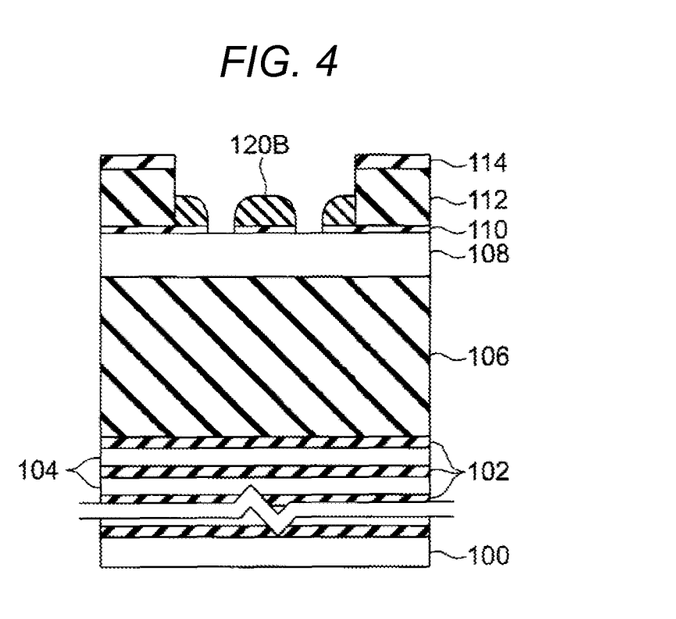
FIG. 4 is a cross-sectional view illustrating a process which is subsequent to FIG. 3.

Subsequently, as shown in FIG. 4, the natural oxidation film 110 is processed using the RIE in such a way as to use the physical guide and the second polymer section 120B as masks. At this time, the film thickness of the second polymer section 120B decreases to, for example, about 30 nm. When the natural oxidation film 110 is processed, an RIE device which uses inductively coupled plasma may be used. For example, a gas which principally comprises fluorocarbons, such as $CF_4$ or the like, is used.

Figure 5:
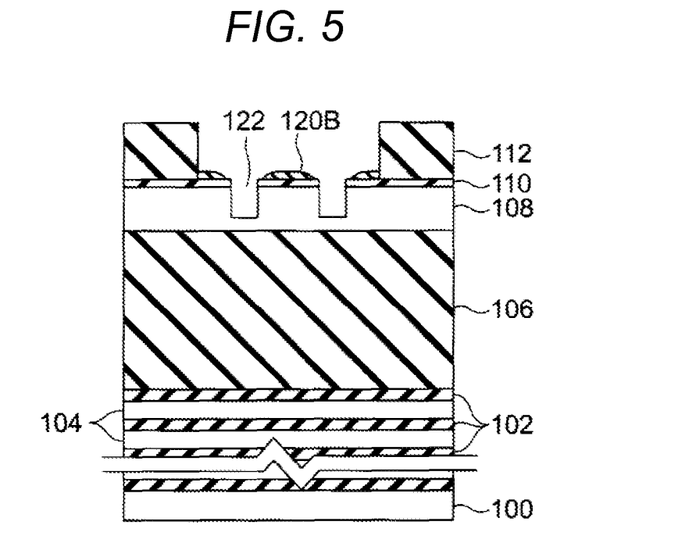
FIG. 5 is a cross-sectional view illustrating a process which is subsequent to FIG. 4.
Figure 6:
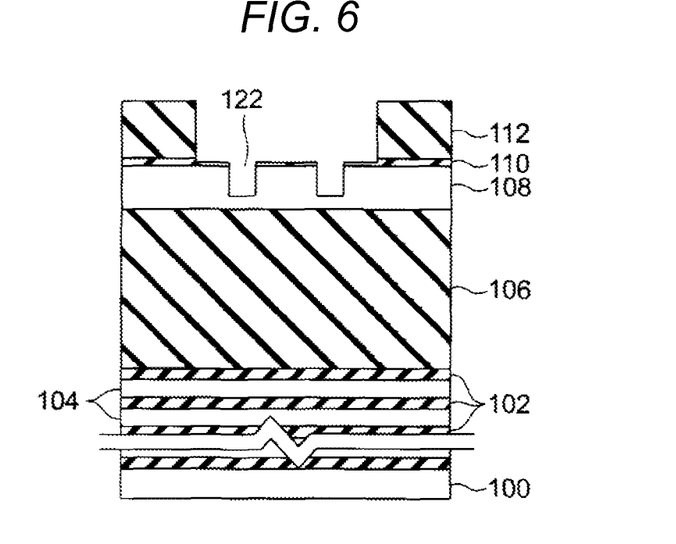
FIG. 6 is a cross-sectional view illustrating a process which is subsequent to FIG. 5.

Subsequently, as shown in FIGS. 5 and 6, the silicon film 108 is processed using RIE in such a way as to use the physical guide, the second polymer section 120B, and the natural oxidation film 110 as masks. At this time, the RIE is performed under the conditions in which a selected ratio of the silicon film 108 to the natural oxidation film 110 increases. For example, the RIE device which uses inductively coupled plasma is used, a gas obtained by mixing HBr with $O_2$ which is equal to or less than 10 volt of the HBr is used, a pressure is equal to or less than 15 mT, and ion energy is equal to or less than 300 eV in a process chamber of the RIE device.

As shown in FIG. 5, the shoulder drop of the second polymer section 120B becomes greater if the silicon film 108 is processed to the depth of about 20 to 30 nm, and the second polymer section 120B is not effective as a mask. However, since processing is performed under the condition in which the etching selectivity of the silicon film 108 to the natural oxidation film 110 is high, the natural oxidation film 110 functions as a mask as shown in FIG. 6, and it is possible to prevent the dimensions of a hole pattern 122, which is formed on the silicon film 108, from expanding. The dimensions of the hole pattern 122 are in the same range as the dimensions of the first polymer section 120A (shown in FIG. 2).

Figure 7:
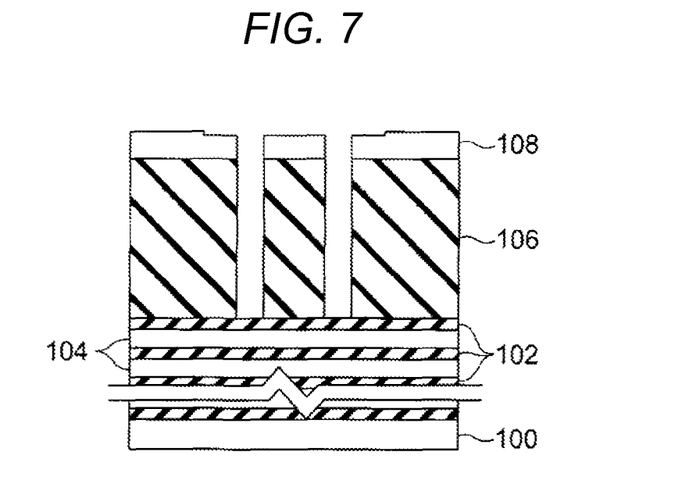
FIG. 7 is a cross-sectional view illustrating a process which is subsequent to FIG. 6.

Subsequently, as shown in FIG. 7, the organic film 106 is processed using RIE and by using the patterned silicon film 108 as a mask.

Figure 8:
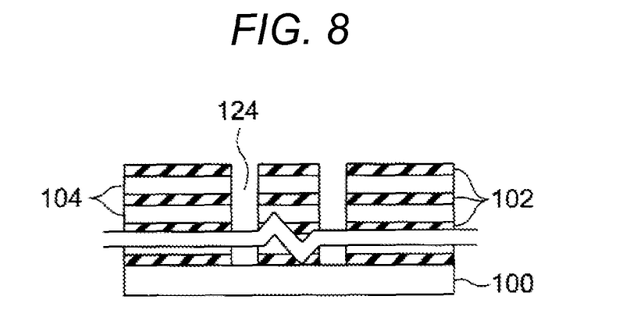
FIG. 8 is a cross-sectional view illustrating a process which is subsequent to FIG. 7.

Subsequently, as shown in FIG. 8, a layered film, which includes the alternately layered TEOS films 102 and amorphous silicon films 104, is processed by using the patterned organic film 106 as a mask. After the layered film is processed, the remaining organic film 106 is removed by ashing.

In this way, it is possible to form a memory hole 124 in the layered film.

Thereafter, when an ONO film is formed on the side wall of the memory hole 124 and amorphous silicon is filled in the center section thereof, it is possible to manufacture a memory cell having a BiCS structure.

As described above, in the embodiment, the natural oxidation film 110 is provided between the micro-phase separation pattern 120 and the silicon film 108, and the pattern shape of the first polymer section 120A is transferred to the natural oxidation film 110. Therefore, after the second polymer section 120B becomes ineffective as the mask for processing the silicon film 108, the natural oxidation film 110 functions as the mask for processing the silicon film 108, the dimensions of the hole pattern 122 which is formed on the silicon film 108 are prevented from expanding, and thus it is possible to form the hole pattern 122 having a high aspect ratio.

The hole pattern 122 is transferred to the organic film 106 (refer to FIG. 7) and then transferred to the layered film which includes the TEOS films 102 and the amorphous silicon films 104 (refer to FIG. 8). Therefore, it is possible to form the fine memory hole 124, which has the same dimensions as that of the first polymer section 120A (shown in FIG. 2), in the layered film which includes the TEOS films 102 and the amorphous silicon films 104.

Comparison Example

A semiconductor device manufacturing method according to a conventional example will be described with reference to FIGS. 9 to 12.

Figure 9:
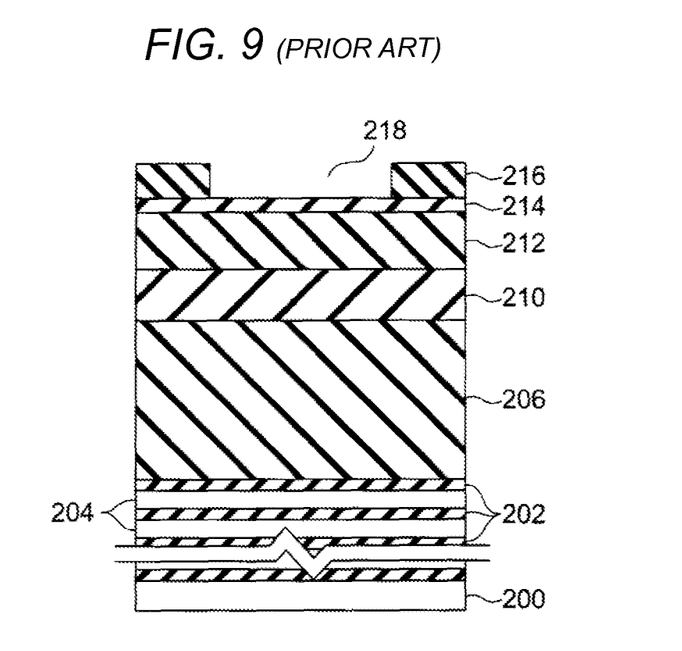
FIG. 9 is a cross-sectional view illustrating a process of a semiconductor device manufacturing method according to a conventional example.

As shown in FIG. 9, TEOS films 202 and amorphous silicon films 204 are alternately layered in 24 layers on a silicon substrate 200. Subsequently, an organic film 206 and a silicon oxide film 210 are formed on the layered TEOS films 202 and the amorphous silicon films 204.

Subsequently, a baking process is performed after applying SOC on the silicon oxide film 210, and thus an organic film 212 is formed. Subsequently, a baking process is performed after applying SOG on the organic film 212, and thus an SOG film 214 is formed. Methods of forming the TEOS films 202, the amorphous silicon films 204, the organic film 206, the organic film 212, and the SOG film 214 are the same as in the above embodiment. In addition, for example, the silicon oxide film 210 is formed by CVD, and the film thickness thereof has the extent of 60 nm.

Subsequently, a resist 216 is applied on the SOG film 214, and a hole pattern 218 which has an elliptic planar shape is formed by performing a lithography process.

Figure 10:
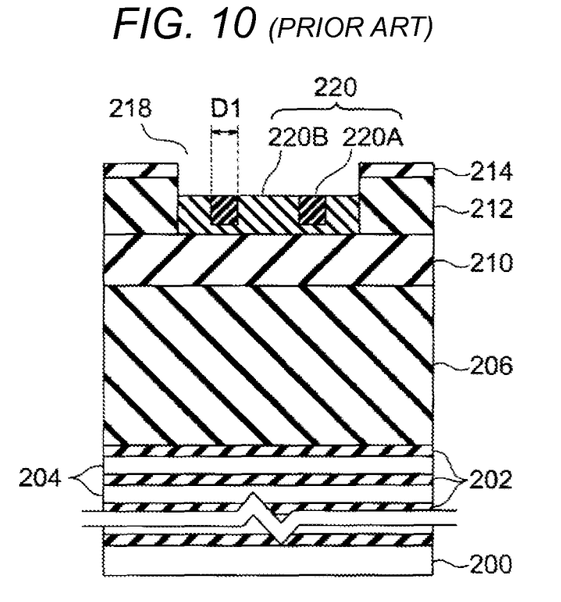
FIG. 10 is a cross-sectional view illustrating a process which is subsequent to FIG. 9.

Subsequently, as shown in FIG. 10, RIE is performed by using the resist 216 as a mask, and the hole pattern 218 is transferred to the SOG film 214. Further, RIE is performed by using the SOG film 214 to which the hole pattern 218 is transferred as a mask, and the hole pattern 218 is transferred to the organic film 212. Therefore, a physical guide which includes the organic film 212 and the SOG film 214 is formed.

Subsequently, a PGMEA solution which includes the block copolymer of PS and PMMA at a concentration of 2.0 wt % is rotationally applied at a rotation ratio of 1500 rpm.

The applied block copolymer flows into the depressed portion (hole pattern 218) of the physical guide, and thus a block copolymer layer is formed. Thereafter, the silicon substrate 200 is heated, and a micro-phase separation pattern 220, which includes a cylindrical first polymer section 220A configured to have the PMMA and a second polymer section 220B configured to have the PS and provided to surround the first polymer section 220A, is formed. The side surface and bottom surface of the cylindrical first polymer section 220A are surrounded by the second polymer section 220B.

Figure 11:
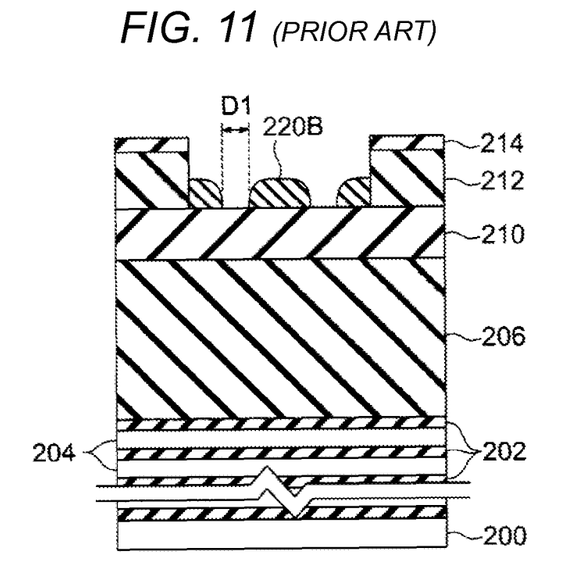
FIG. 11 is a cross-sectional view illustrating a process which is subsequent to FIG. 10.

Subsequently, as shown in FIG. 11, the first polymer section 220A in the micro-phase separation pattern 220 is selectively removed by a wet development process. Further, etch back is performed using the RIE, and thus the second polymer section 220B which is located on the lower side of the first polymer section 220A is removed, thereby exposing the upper surface of the silicon oxide film 210. After the etch back is performed, the film thickness of the remaining second polymer section 220B is, for example, about 40 nm.

Figure 12:
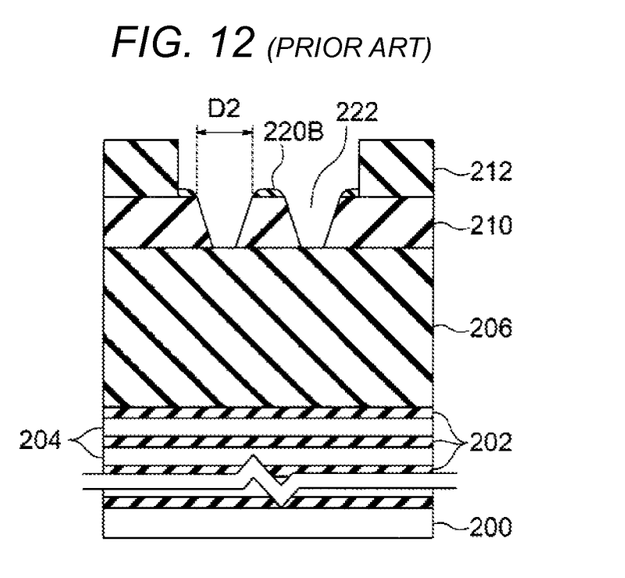
FIG. 12 is a cross-sectional view illustrating a process which is subsequent to FIG. 11.

Subsequently, as shown in FIG. 12, the silicon oxide film 210 is processed using the RIE in such a way as to use the physical guide and the second polymer section 220B as masks. Since the silicon oxide film 210 becomes a mask when the organic film 206 is processed, the film thickness thereof is large. Therefore, the second polymer section 220B becomes ineffective as the mask during the processing of the silicon oxide film 210, and the dimensions of the hole pattern 222 which is formed in the silicon oxide film 210 expand. The dimensions D2 of the hole pattern 222 are greater than the dimensions D1 of the first polymer section 220A (refer to FIGS. 10 and 11).

In the method according to the conventional example, the shape of the hole pattern 222, the dimensions of which expand, is transferred to the organic film 206. Therefore, it is not possible to form a fine memory hole in the layered film which includes the TEOS films 202 and the amorphous silicon films 204.

In contrast, in the above embodiment, after the second polymer section 120B becomes ineffective as a mask for the processing of the silicon film 108, the natural oxidation film 110 provided between the micro-phase separation pattern 120 and the silicon film 108 functions as the mask for the processing of the silicon film 108. Therefore, it is possible to prevent the dimensions of the hole pattern 122, which is formed on the silicon film 108 having a large film thickness, from expanding, and it is possible to form the hole pattern 122 which has a high aspect ratio. In addition, since the natural oxidation film 110 is formed by taking out the substrate 100 from the chamber and exposing the substrate to the air, on which the silicon film 108 is formed, it is possible to suppress an increase in the number of processes or manufacturing cost.

Although an example, in which a hole is formed in the layered film, which includes the TEOS films and the amorphous silicon films, is described in the above embodiment, it is also possible to apply the exemplary embodiment to a case in which a hole having a high aspect ratio is formed in a layered film which has metal films and silicon oxide films, a silicon layered film, a silicon oxide film which includes a single layer having a large film thickness, or the like.

In addition, an example, in which the silicon film 108 is exposed to air and the natural oxidation film 110 is formed on the surface section of the silicon film 108, is described in the above embodiment. However, after the silicon film 108 is formed, a silicon oxide film which has a film thickness to the extent of 10 nm may be formed on the surface of the silicon film 108 using thermal oxidation. Therefore, the film thickness of the silicon film 108 which can be processed becomes large, and it is possible to process a structure which has a further higher aspect ratio. Alternatively or additionally, a silicon nitride film may be formed on the silicon film 108 through thermal nitridation, and the silicon nitride film may be used as a mask for the processing of the silicon film 108.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device manufacturing method, comprising:
    depositing a silicon film above a semiconductor substrate;
    forming an insulating film, which includes silicon oxide or silicon nitride, on the silicon film;
    forming a physical guide, having at least one depressed portion, above the insulating film;
    forming a directed self-assembly material layer which includes a first polymer and a second polymer in the depressed portion of the physical guide;
    phase-separating the directed self-assembly material layer into a first region including the first polymer and a second region including the second polymer, the second region having a cylindrical shape, and the first region surrounding a side surface and a bottom surface of the second region;
    removing the second region;
    processing the insulating film using the physical guide and the first region as masks, and transferring a pattern corresponding to the second region to the insulating film; and
    processing the silicon film using the processed insulating film as a mask.

2. The method according to claim 1, further comprising:
    transferring the pattern to a plurality of alternately layered first and second films formed on the substrate.

3. The method according to claim 1, wherein the silicon film is formed in a chamber, and the insulating film including silicon oxide is formed by exposing the silicon film to air.

4. The method according to claim 1, wherein the insulating film including silicon oxide is formed by thermal oxidation of a surface of the silicon film.

5. The method according to claim 1, wherein the insulating film including silicon nitride is formed by thermal nitridation of a surface of the silicon film.

6. The method according to claim 1, wherein the silicon film is processed using a reactive ion etching process in the presence of a gas comprising HBr and $O_2$, at a pressure equal to or less than 15 mT, and an ion energy equal to or less than 300 eV.

7. A semiconductor device manufacturing method, comprising:
depositing a silicon film above a semiconductor substrate;
forming an insulating film, which includes silicon oxide or silicon nitride, on the silicon film;
forming a physical guide having a depressed portion above the insulating film;
forming a directed self-assembly material layer which includes a first polymer and a second polymer in the depressed portion of the physical guide;
phase-separating the directed self-assembly material layer into a first region including the first polymer and a second region including the second polymer, the second region having a cylindrical shape, and the first region surrounding a side surface and a bottom surface of the second region;
removing the second region;
processing the insulating film using the physical guide and the first region as masks, and transferring a pattern corresponding to the second region to the insulating film; and
processing the silicon film using the processed insulating film, the physical guide, and the first region as masks.

8. The method according to claim 7, further comprising:
transferring the pattern to a plurality of alternately layered first and second films formed on the substrate.

9. The method according to claim 7, wherein the silicon film is formed in a chamber, and the insulating film including silicon oxide is formed by exposing the silicon film to air.

10. The method according to claim 7, wherein the insulating film including silicon oxide is formed by thermal oxidation of a surface of the silicon film.

11. The method according to claim 7, wherein the insulating film including silicon nitride is formed by thermal nitridation of a surface of the silicon film.

12. The method according to claim 7, wherein the silicon film is processed using a reactive ion etching process in the presence of a gas comprising HBr and $O_2$, at a pressure equal to or less than 15 mT, and an ion energy equal to or less than 300 eV.

13. A semiconductor device manufacturing method, comprising:
depositing a plurality of first films alternately layered with a plurality of second films to form a layered film stack above a semiconductor substrate;
forming an organic film above the layered film stack;
depositing a silicon film above the organic film in a chamber;
forming a silicon oxide film on the silicon film by removing the semiconductor substrate from the chamber and exposing the silicon film to air;
forming a physical guide above the silicon oxide film, the physical guide having one or more depressed portions;
forming a directed self-assembly material layer including a first polymer and a second polymer in the depressed portions of the physical guide;
phase-separating the directed self-assembly material layer into a first region including the first polymer and a second region including the second polymer;
removing the second region;
processing the silicon oxide film using the physical guide and the first region as masks, and transferring a pattern corresponding to the second region to the silicon oxide film; and
processing the silicon film by performing a reactive ion etching process using the processed silicon oxide film, the physical guide, and the first region as masks,
wherein the second region has a cylinder shape, and the first region surrounds a side surface and a bottom surface of the second region.

14. The method according to claim 13, further comprising:
transferring the pattern to the layered film stack.

15. The method according to claim 13, further comprising:
removing the first region located under the bottom surface of the second region after removing the second region.

16. The method according to claim 13, wherein a gas comprising HBr and $O_2$ is provided to a process chamber during the reactive ion etching process.

17. The method according to claim 16, wherein a pressure equal to or less than 15 mT is maintained in the process chamber during the reactive ion etching process.

18. The method according to claim 16, wherein an ion energy equal to or less than 300 eV is used during the reactive ion etching process.

* * * * *